United States Patent [19]
Nakakura et al.

[11] Patent Number: 5,512,844
[45] Date of Patent: Apr. 30, 1996

[54] OUTPUT CIRCUIT WITH HIGH OUTPUT VOLTAGE PROTECTION MEANS

[75] Inventors: Yasuhiro Nakakura; Shouichi Yoshizaki, both of Osaka, Japan

[73] Assignee: Matsushita Electric Industrial Co., Ltd., Osaka, Japan

[21] Appl. No.: 501,739

[22] Filed: Jul. 12, 1995

[30] Foreign Application Priority Data

Jul. 13, 1994  [JP]  Japan ..................... 6-161442

[51] Int. Cl.⁶ ............................. H03K 19/0125
[52] U.S. Cl. .................. 326/81; 326/27; 326/58
[58] Field of Search ................... 326/21, 27, 81, 326/80, 83, 86, 58

[56] References Cited

U.S. PATENT DOCUMENTS

| | | | |
|---|---|---|---|
| 4,782,250 | 11/1988 | Adams et al. | 307/473 |
| 5,248,907 | 9/1993 | Lin | 326/83 |
| 5,266,849 | 11/1993 | Kitahara | 326/21 |
| 5,338,978 | 8/1994 | Larsen | 326/21 |
| 5,406,140 | 4/1995 | Wert | 326/68 |
| 5,467,031 | 11/1995 | Nguyen | 326/58 |

Primary Examiner—Edward P. Westin
Assistant Examiner—Andrew Sanders
Attorney, Agent, or Firm—Willian Brinks Hofer Gilson & Lione

[57] ABSTRACT

In the case where an external signal line is driven by a circuit other than an output circuit with a voltage higher than an on-chip power-source voltage, if an output transistor is activated in the output state immediately after the driving of the external signal line by the above other circuit was cancelled, a voltage equal to or higher than the breakdown voltage of an oxide film of a transistor composing the output circuit is applied thereto. To prevent this, there is provided a voltage detecting means for detecting a voltage value of the above external signal line being higher than a value in the vicinity of the internal power-source voltage and generating a detection signal, which inhibits the activation of the output transistor. Consequently, in the output circuit of an LSI fabricated using submicron design rules, the application of a voltage equal to or higher than the breakdown voltage of an oxide film of each of the transistors composing the output circuit is prevented, resulting in increased reliability of the output circuit.

20 Claims, 8 Drawing Sheets

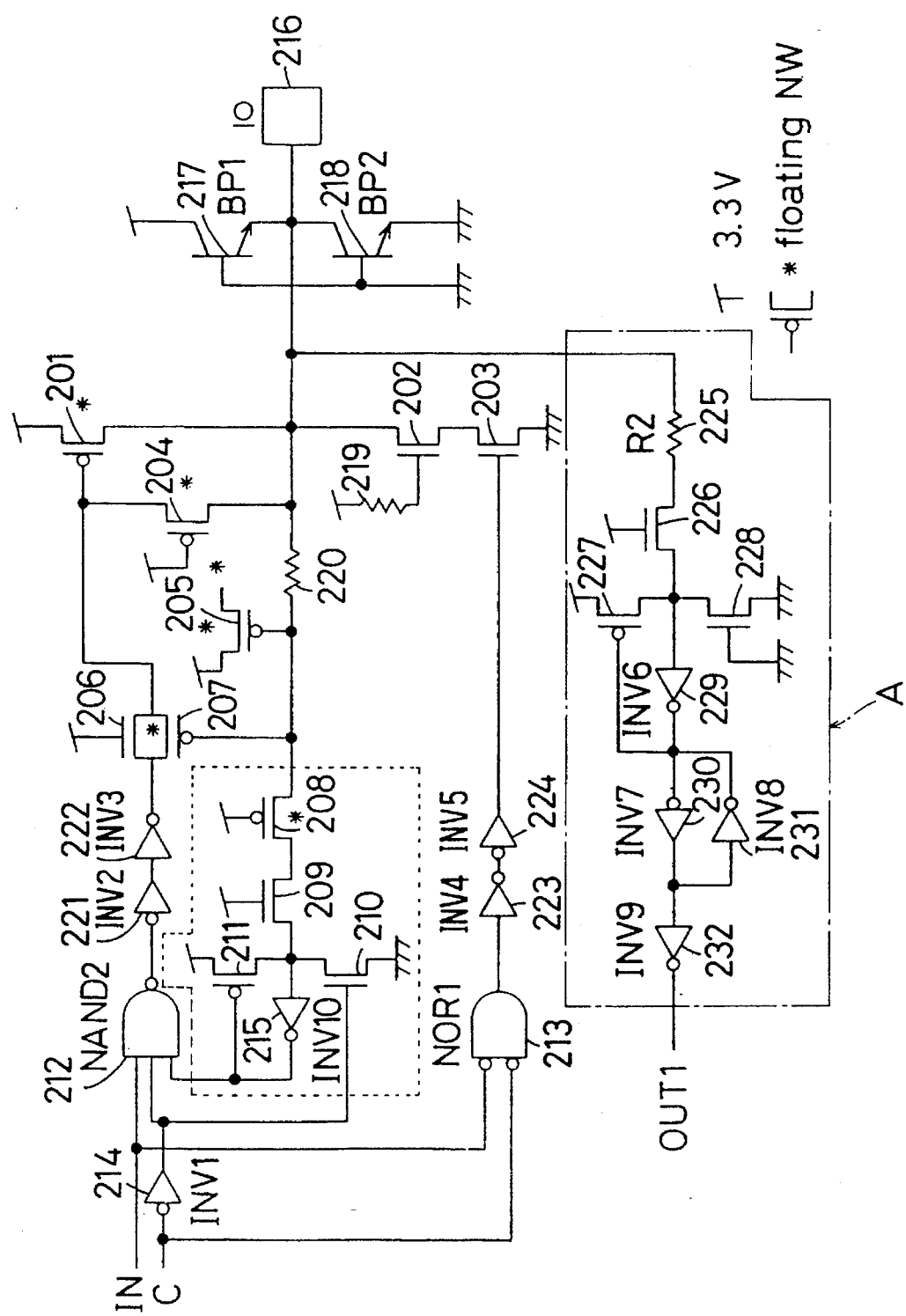

Fig.7(x)
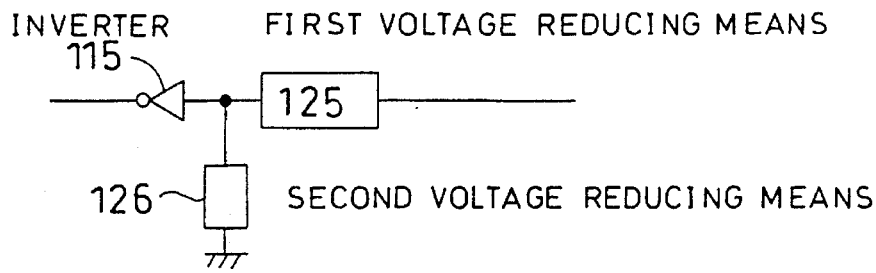
Fig.7(a)　　Fig.7(e)　　Fig.7(i)
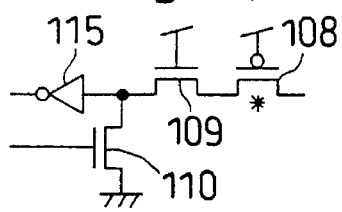 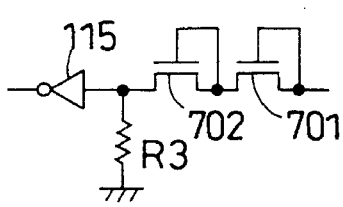 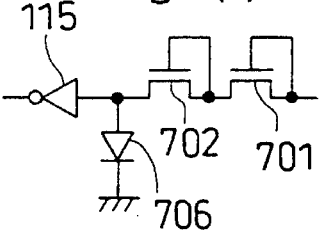
Fig.7(b)　　Fig.7(f)　　Fig.7(j)
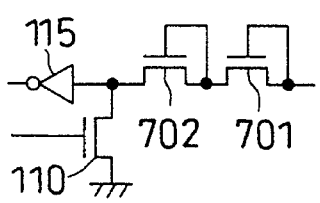 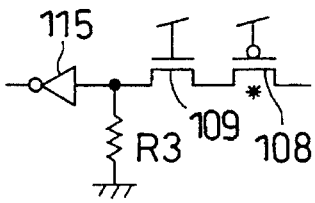 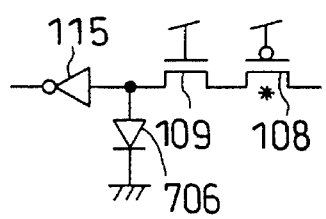
Fig.7(c)　　Fig.7(g)　　Fig.7(k)
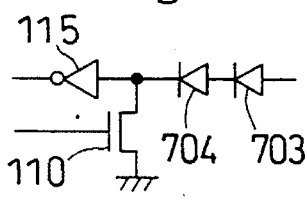 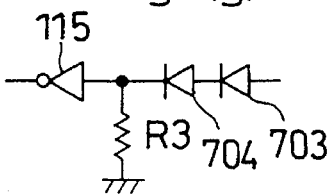 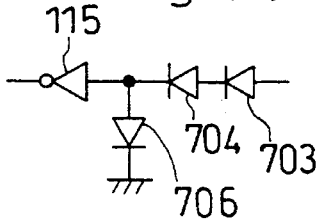
Fig.7(d)　　Fig.7(h)　　Fig.7(l)
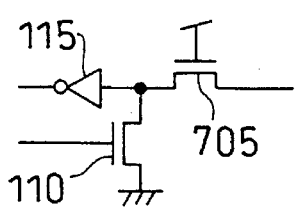 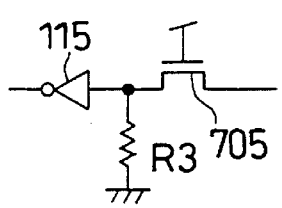 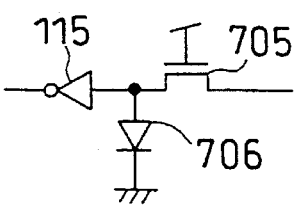

THIRD VOLTAGE REDUCING MEANS  FIRST VOLTAGE REDUCING MEANS
115 INVERTER
126 SECOND VOLTAGE REDUCING MEANS

1

OUTPUT CIRCUIT WITH HIGH OUTPUT VOLTAGE PROTECTION MEANS

BACKGROUND OF THE INVENTION present invention relates to an improved output circuit operated by an internal power source. More particularly, it relates to measures to protect an output circuit having an output terminal connected to an external signal line when a signal higher in voltage than the above internal power source is applied by other circuit to the above external signal line.

With the increasing miniaturization of LSIs, the thickness of an oxide film used therein has been reduced in recent years. Accordingly, operation only with a voltage of 3.3 V or less is ensured to the latest LSIs fabricated using submicron design rules, while conventional LSIs fabricated using 1 μm design rules are operable with a voltage of 5 V. In the case of using the latest LSI operable with a voltage of 3.3 V, therefore, there should be no problem if all the external LSIs are of the latest type (items operable with 3.3 V). However, the following problem arises if the external LSIs are conventional ones operable with a voltage of 5 V (items operable with 5 V). Specifically, if an external signal line is connected to each of a 3.3 V I/O pin of an output circuit provided in the latest LSI and to a 5 V I/O pin of an output circuit provided in any conventional LSI, a voltage of 5 V from the above external signal line is applied to the 3.3 V I/O pin of the output circuit of the latest LSI, since the potential of the external signal line has been set to 5 V by the output circuit of the conventional LSI. As a result, a current flows into the output circuit of the latest LSI operable with 3.3 V through the 3.3 V I/O pin and a voltage of 5 V is applied to an oxide film, which leads to the problem that normal operation cannot be ensured to the latest LSI.

To overcome the problem, a circuit as shown in FIG. 3(a) has conventionally been proposed as a 3 V/5 V interface I/O circuit with which normal operation of the latest LSI is ensured.

Below, a description will be given to the conventional output circuit shown in FIG. 3(a). In the drawing is shown a bonding pad 601 as an output terminal, to which is connected an external signal line (not shown). To the external signal line is applied a signal having a higher voltage (e.g., 5 V) than an on-chip (internal) power-source voltage VDD (e.g., 3.3 V) by other output circuit.

In the drawing are also shown: a P-channel (hereinafter referred to as P-ch) output transistor 602 for supplying the internal power-source voltage VDD to the above pad 601; an N-channel (hereinafter referred to as N-ch) output transistor for connecting the above pad 601 to the ground; an input signal IN; a control signal C which brings the above output circuit into an output state when the potential thereof is LOW and into a high impedance state when the potential thereof is HIGH; and an inverter 611.

In the drawing are further shown: an NAND circuit 609 which produces a LOW output if the control signal C is LOW and the input signal IN is HIGH, thereby turning ON the above P-ch output transistor 602 and bringing the pad 601 into a HIGH output state; and an NOR circuit 610 which produces a HIGH output if the control signal C is LOW and the input signal IN is LOW, thereby turning ON the above N-ch output transistor 604 and bringing the pad 601 into a LOW output state.

The output circuit of FIG. 3(a) is obtained by adding to the above basic structure the following components, which are: N-ch transistors 603 and 607; and P-ch transistors 605, 606, and 608 using a substrate in common to which no power-source voltage VDD has been applied. In the drawing, the mark * designates a substrate potential different from the on-chip power-source voltage VDD. The P-ch transistor 606 has its drain connected to the substrate.

Next, a description will be given to the operation of the above output circuit of FIG. 3(a).

If a voltage of 5 V is applied from the external signal line to the bonding pad 601 with its output being in the high impedance state, a current is allowed to flow from the drain of the P-ch transistor 602 to its substrate through the PN junction thereof, thereby raising the potential of the substrate. After the potential of the substrate became 5 V, the above current flowing through the PN junction does not flow any longer. Since the internal power-source voltage VDD (3.3 V) has been applied to the gate of the P-ch transistor 605, the P-ch transistor 605 is in the ON state with respect to 5 V. Consequently, a current is allowed to flow from the bonding pad 601 to the gate of the P-ch output transistor 602 via the P-ch transistor 605. After the potential of the P-ch output transistor 602 became 5 V, the drain current from the P-ch transistor 605 does not flow any longer. Moreover, since the P-ch output transistor 602 is turned OFF when the potential of the gate of the P-ch output transistor 602 became 5 V, a current from the bonding pad 601 to the internal power source VDD does not flow any longer. Since the internal power-source voltage VDD has been applied to the gate of the N-ch transistor 607, the N-ch transistor 607 remains in the OFF state even if the potential of the drain of the N-ch transistor 607 is 5 V, so that the potential of 5 V is not transmitted to the output of the NAND circuit 609. As for the P-ch transistor 608, since the respective potentials of the gate and drain thereof are 5 V, the P-ch transistor 608 also remains in the OFF state, so that the potential of 5 V is not transmitted to the output of the NAND circuit 609, either. The P-ch transistor 606 is provided for the purpose of returning, when the potential of the bonding pad 601 shifted to the LOW level, the potential of the N-WELL designated by the mark * to the power-source voltage VDD (3.3 V).

Thus, the potentials at the gate, drain, and source of each of the P-ch transistors 602, 605, 606, and 608 and N-ch transistor 607 are either the internal power-source voltage VDD (3.3 V) or 5 V. Hence, there is no possibility that a voltage equal to or higher than the breakdown voltage of a gate oxide film of each of the transistors is constantly applied to the gate oxide film, so that normal operation of the output circuit with 3.3 V is ensured.

However, as a result of close examination of the operation of the above circuit, the present inventors have found the drawback that, even in the above structure, a voltage equal to or higher than the breakdown voltage may be transiently placed on an oxide film of a transistor when a transition is made from the high impedance state to the output state, from the output state to the high impedance state, or from the output state to the input state.

In other words, the present inventors have found the drawback that, as diagrammatically shown in FIG. 3(b) and as can be appreciated from the result of simulation by a transistor simulator SPICE shown in FIG. 3(c), the voltage between the gate and source of the P-ch transistor 608 may be equal to or higher than the breakdown voltage of the oxide film of the P-ch 608 and placed thereon when the bonding pad 601 makes a transition from the high impedance state of 5 V to the output state of 3 V.

The foregoing drawback is not limited to a transient period during which the output state is shifting, as described above. The drawback also arises when, e.g., the predetermined timing was not provided in the HIGH output state and the voltage of 5 V is applied. The above drawback is also observed in an output circuit the structure of which is not limited to that shown in FIG. 3(a).

SUMMARY OF THE INVENTION

An object of the present invention is to prevent, even in the case where a bonding pad (output terminal) of an output circuit is connected to an external signal line and a voltage (signal) of 5 V higher than an on-chip power-source voltage of 3.3 V, e.g., is applied to the external signal line, a voltage equal to or higher than the breakdown voltage of an oxide film of a transistor from being placed thereon in a transient output state of the output circuit.

To overcome the above problem, the output circuit of the present invention is provided with a voltage detecting means for detecting, in a transient state in which the voltage placed on the bonding pad is shifting, the lowering of the voltage to the vicinity of the internal power-source voltage, so that the output state of the output circuit is controlled only by a detection signal outputted from the voltage detecting means.

Specifically, the output circuit of the present invention has been implemented based on the premise that it is an output circuit connected to an internal power source so as to output a signal having a voltage of the above internal power source to an external signal line and that a signal having a higher voltage than the voltage of the above internal power source is applied to the above external signal line by a circuit other than the above output circuit. The above output circuit comprises: an output pad element to which the above external signal line is connected; a signal generating circuit for receiving an external control signal inputted from the outside and generating a pullup control signal based on the external control signal; an output transistor which is interposed between the above internal power source and the above output pad element and which is turned ON in response to the pullup control signal from the above signal generating circuit so as to supply the voltage of the above internal power source as a signal to the above output pad element; and a voltage detecting means for receiving a signal from the above external signal line, detecting a voltage value of the external signal higher than a voltage value in the vicinity of the voltage value of the above internal power source, and generating a voltage detection signal, the generation of the pullup control signal by the above signal generating circuit being inhibited by the voltage detection signal from the above voltage detecting means, irrespective of the content of the above external control signal.

With the above structure, if the external signal line is driven by other circuit and the voltage of the external signal line is equal to or higher (e.g., 5 V) than the internal power-source voltage VDD (e.g., 3.3 V), the higher voltage has been applied to the output pad element in the output circuit of the present invention and the voltage is inputted to the voltage detecting means. Under these circumstances, during a period during which the output state of the output pad element makes a transition, i.e., when the driving of the external signal line by the above other circuit is cancelled, the voltage of the above external signal line is lowered from 5 V. If the voltage of the external signal line is higher than a value in the vicinity of the internal power-source voltage VDD (3.3 V) (e.g., 3.3 V equal to the internal power-source voltage VDD), the voltage detecting means detects the voltage value and outputs a voltage detection signal. In response to the above voltage detection signal, the signal generating circuit inhibits the generation of a pullup control signal, so that the output transistor is forcibly turned OFF. As a result, even during a period during which the output state of the output pad element makes a transition, a voltage equal to or higher than the breakdown voltage of the oxide film is not placed between the gate and source and between the gate and drain in any one of the various transistors composing the output circuit, thereby preventing the breakdown thereof.

The above objects and novel features of the present invention will be more apparent from the reading of the following description in conjunction with the accompanying drawings.

BRIEF DESCRIPTION OF THE DRAWINGS

The accompanying drawings show the preferred embodiments of the present invention, in which:

FIG. 4 is a view showing the structure of an input/output circuit obtained by adding an input circuit to the output circuit of the first embodiment;

FIG. 7(x) is a block diagram showing a basic structure of a voltage detecting means;

FIG. 7(a) is a view showing a first variation of the voltage detecting means;

FIG. 7(b) is a view showing a second variation of the voltage detecting means;

FIG. 7(c) is a view showing a third variation of the voltage detecting means;

FIG. 7(d) is a view showing a fourth variation of the voltage detecting means;

FIG. 7(e) is a view showing a fifth variation of the voltage detecting means;

FIG. 7(f) is a view showing a sixth variation of the voltage detecting means;

FIG. 7(g) is a view showing a seventh variation of the voltage detecting means;

FIG. 7(h) is a view showing an eighth variation of the voltage detecting means;

FIG. 7(i) is a view showing a ninth variation of the voltage detecting means;

FIG. 7(j) is a view showing a tenth variation of the voltage detecting means;

FIG. 7(k) is a view showing an eleventh variation of the voltage detecting means;

FIG. 7(*l*) is a view showing a twelfth variation of the voltage detecting means;

FIG. 8(*m*) is a view showing a thirteenth variation of the voltage detecting means;

FIG. 8(*n*) is a view showing a fourteenth variation of the voltage detecting means;

FIG. 8(*o*) is a view showing a fifteenth variation of the voltage detecting means;

FIG. 8(*p*) is a view showing a sixteenth variation of the voltage detecting means;

FIG. 8(*q*) is a view showing a seventeenth variation of the voltage detecting means;

FIG. 8(*r*) is a view showing an eighteenth variation of the voltage detecting means;

FIG. 8(*s*) is a view showing a nineteenth variation of the voltage detecting means;

FIG. 8(*t*) is a view showing a twentieth variation of the voltage detecting means;

FIG. 8(*u*) is a view showing a twenty-first variation of the voltage detecting means;

FIG. 8(*v*) is a view showing a twenty-second variation of the voltage detecting means; and FIG. 8(*w*) is a view showing a twenty-third variation of the voltage detecting means.

DETAILED DESCRIPTION OF THE INVENTION

Below, preferred embodiments of the present invention will be described with reference to the accompanying drawings.

(First Embodiment)

Figure 1:
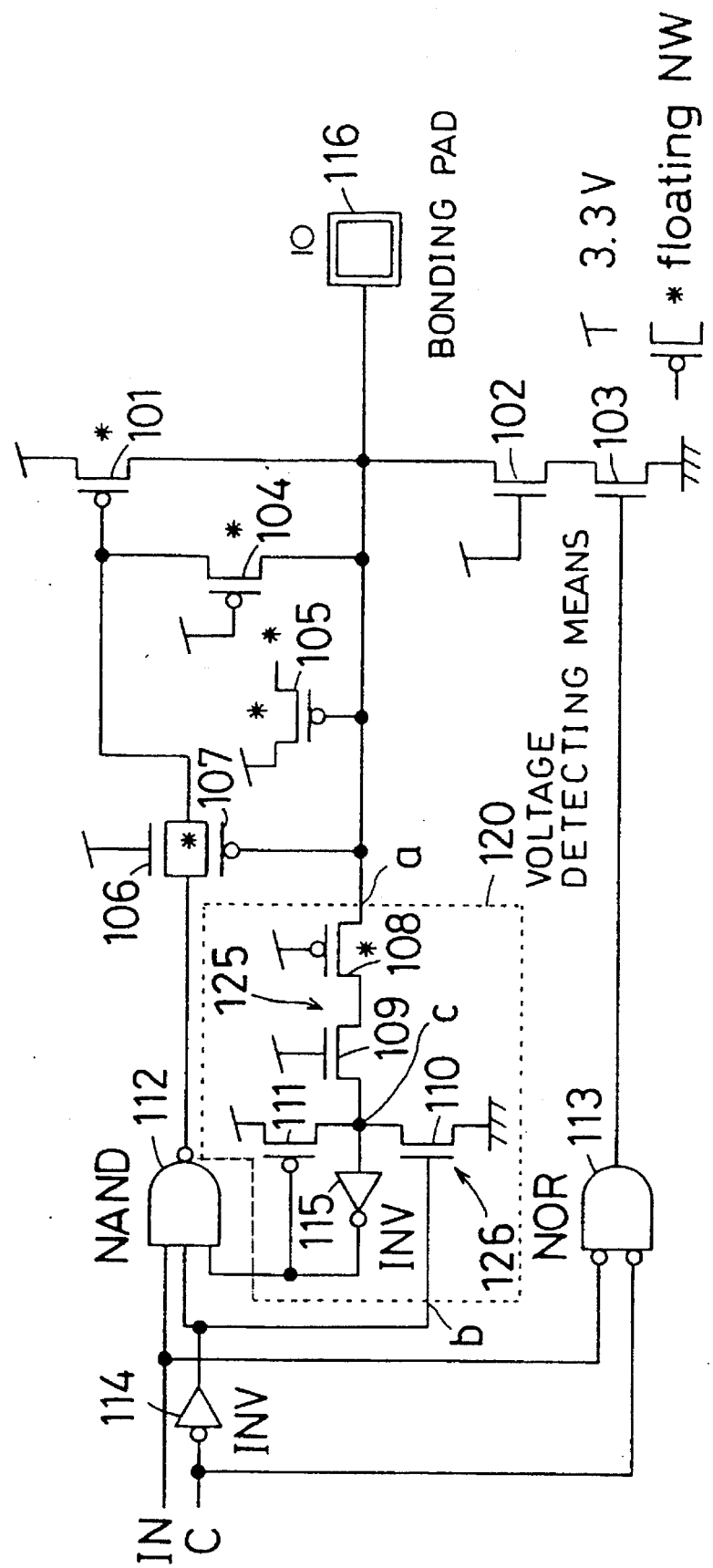
FIG. 1 is a view showing the structure of an output circuit in a first embodiment of the present invention.

FIG. 1 shows the structure of an output circuit in a first embodiment of the present invention.

In the drawing is shown a bonding pad 116 (output pad element) to which is connected an external signal line (not shown). To the external signal line is applied a higher voltage (e.g., 5 V) than an on-chip power-source voltage (internal power-source voltage) VDD (e.g., 3 V) by other output circuit.

There are also shown P-ch transistors 101, 104, 105, 107, and 108 using a substrate in common to which no internal power-source voltage VDD has been applied. In the drawing, the mark * designates a substrate potential different from the on-chip power-source voltage VDD. The P-ch transistor 105 has its drain connected to the substrate. To the source of the above P-ch output transistor is applied the internal power-source voltage VDD, so that the internal power-source voltage VDD is supplied to the above output pad element 116 by turning ON the P-ch output transistor 101.

In the drawing are also shown: a P-ch transistor 11; N-ch transistors 102, 103, 106, 109, and 110; an NAND circuit (signal generating circuit) 112 for generating a pullup signal (LOW level signal) to be outputted to the gate of the above P-ch output transistor 101; an inverter 114; an NOR circuit 113; an inverter (inverting circuit) 115; an input signal IN; a control signal (external control signal) C which brings the above output circuit into an output state when the potential thereof is LOW and into a high impedance state when the potential thereof is HIGH.

There has been added a voltage detecting means 120 to characterize the present invention.

To each of the gates of the above N-ch transistors 106, 102, and 109 and P-ch transistors 104 and 108 is applied the internal power-source voltage VDD. Each of the sources of the N-ch transistors 110 and 103 is connected to the ground. To each of the sources of the P-ch transistors 101, 105, and 111 is applied the internal power-source voltage VDD. The bonding pad 116 is connected to the source of the P-ch transistor 104, to each of the gates of the P-ch transistors 105 and 107, to the drain of the P-ch transistor 101, to the drain of the N-ch transistor 102, and to a first input portion a of the voltage detecting means 120. The source of the N-ch transistor 102 is connected to the drain of the N-ch transistor 103. The gate of the P-ch transistor 101 is connected to the drain of the P-ch transistor 104, to the drain of the P-ch transistor 107, and to the drain of the N-ch transistor 106. The drain of the P-ch transistor 105 is connected to the substrate of the P-ch transistors 101, 104, 105, 107, and 108.

The control signal C is inputted to the input of the inverter 114 and to a first input terminal of the NOR circuit 113. The output from the above NOR circuit 113 is inputted to the gate of the N-ch transistor 103. The above input signal IN is inputted to a first input terminal of the above NAND circuit 112 and to a second input terminal of the above NOR circuit 113. The output from the above inverter 114 is inputted to a second input of the above NAND circuit 112 and to a second input portion b of the above voltage detecting means 120. The output from the above voltage detecting means 120 is inputted to a third input of the above NAND circuit 112. The output from the above NAND circuit 112 is inputted to each of the sources of the P-ch transistor 107 and N-ch transistor 106.

In the above voltage detecting means 120, the first input portion a is connected to the source of the P-ch transistor 108. The drain of the above P-ch transistor 108 is connected to the source of the N-ch transistor 109. The drain of the above N-ch transistor 109 is connected to the drain of the N-ch transistor 110, to the drain of the P-ch transistor 111, and to the input of the inverter 115. The gate of the above N-ch transistor 110 is connected to the second input portion b of the voltage detecting means 120. The output from the above inverter 115 is used as the output from the above voltage detecting means 120 and inputted to the gate of the above P-ch transistor 111.

In the above voltage detecting means 120, the P-ch transistor 108 and N-ch transistor 109 constitute a first voltage reducing means 125, while the N-ch transistor 110 constitutes a second voltage reducing means 126.

Below, a description will be given to the operation of the output circuit thus constituted with reference to FIG. 1.

Initially, with a voltage of 5 V being applied from the external signal to the bonding pad 106 in the high impedance state in which the control signal C is on the HIGH level, the N-ch transistor 110 is in the OFF state. Since the internal power-source voltage VDD has been applied to the gate of the P-ch transistor 108, the potential of each of the source and drain becomes 5 V. The internal power-source voltage VDD has also been applied to the gate of the N-ch transistor 109, so that the potential of the input to the inverter 115 is raised by the above N-ch transistor 109 to the value of VDD−Vth obtained by subtracting a threshold voltage Vth of the N-ch transistor 109 from the internal power-source voltage VDD. Since the output from the above inverter 115 becomes LOW, the potential of the input to the inverter 115 is raised by the P-ch transistor 111 to the value of the internal power-source voltage VDD.

Subsequently, upon switching from the above high impedance to the output state, i.e., when the control signal C shifts from HIGH to LOW, the state in which the external signal line is driven by other circuit with a voltage of 5 V is cancelled by the above other circuit. At this stage, the N-ch transistor 110 is turned ON with the shifting of the control signal C from HIGH to LOW, while the bonding pad 116 is no more driven with 5 V from the external signal line. At the same time, the bonding pad 116 is discharged via the P-ch transistor 111 and via the N-ch transistors 109 and 110, so that the potential of the bonding pad 116 is lowered and the input potential of the inverter 115 is lowered simultaneously. When the potential between the above bonding pad 116 and the gate of the P-ch transistor 108 becomes a value equal to or lower than the threshold voltage of the above P-ch transistor 108, the P-ch transistor 108 is turned OFF, so that the input potential of the inverter 115 is lowered to the value of the ground potential VSS. If the gate width of the above N-ch transistor 110 is previously set smaller than those of the above N-ch transistor 109 and of the above P-ch transistor 108, the output from the inverter 115 Will shift from LOW to HIGH after the above P-ch transistor 108 was turned OFF. In short, during the period during which a voltage exceeding VDD+Vth (a voltage value in the vicinity of the internal power-source voltage VDD) is applied to the bonding pad 116, the output from the inverter 115 remains LOW (a voltage detection signal is outputted), while the output from the NAND circuit 112 does not shift to the LOW level (a pullup control signal is not outputted).

Thus, according to the present embodiment, the pullup control signal to be inputted to the gate of the P-ch output transistor 101 connected to the bonding pad 116 can be turned OFF by the voltage detecting means 120 when the output potential of the bonding pad 116 makes a transition, so that each transistor inside the output circuit is free from transient application of a voltage equal to or higher than the breakdown voltage thereof.

(Second Embodiment)

Below, a second embodiment of the present invention will be described with reference to the drawings.

Figure 3A:
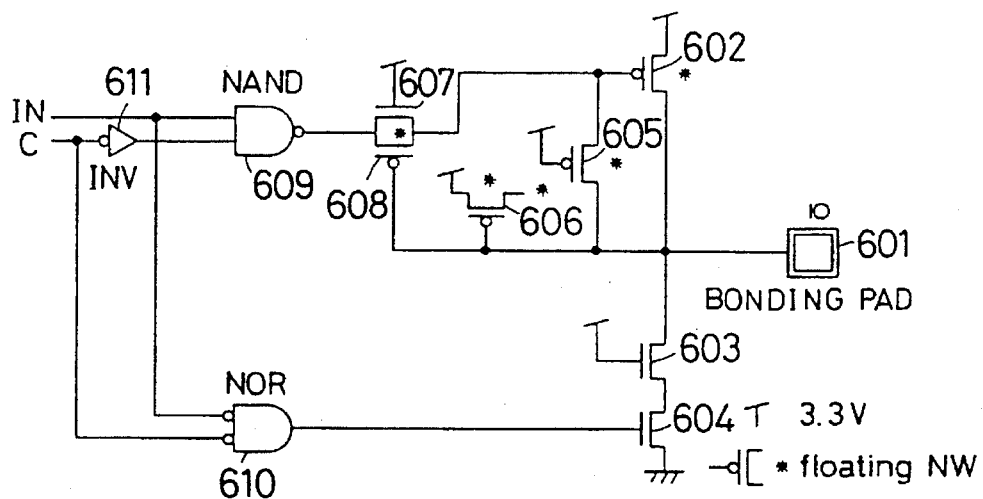
FIG. 3(a) is a view showing the structure of a conventional output circuit.
Figure 3B:
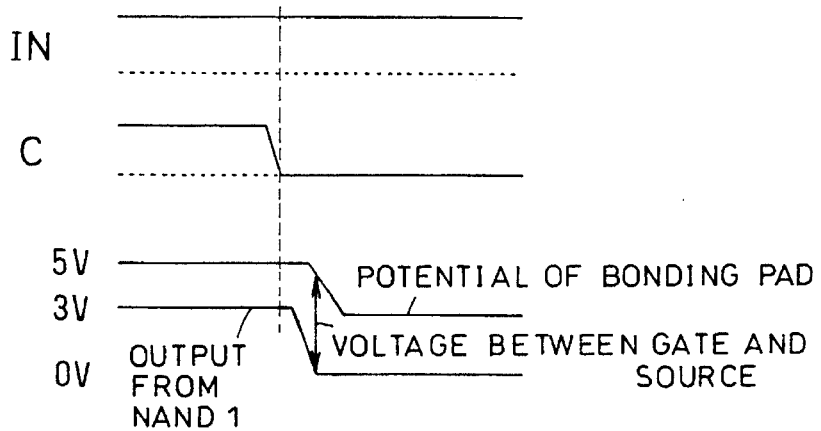
FIG. 3(b) is a diagram showing a transient voltage varying state of an internal transistor in the conventional output circuit.
Figure 3C:
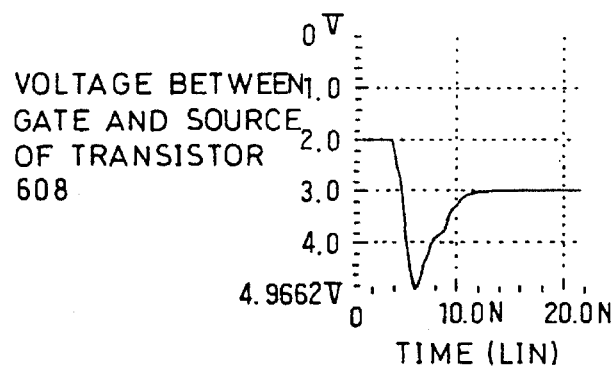
FIG. 3(c) is a view showing the result of simulation of the transient voltage varying state of the internal transistor in the conventional output circuit.

FIG. 3 is a circuit diagram of an output circuit in the second embodiment of the present invention.

The output circuit of the second embodiment is different in structure from the output circuit of the first embodiment as follows: the voltage of the bonding pad 116 is inputted to a voltage detecting means 200 which uses the output from an inverter 204 as its output; the output from the above voltage detecting means 200 is inputted to the third input of the NAND circuit; in the above voltage detecting means 200, the input signal is inputted to the source and gate of an N-ch transistor 201; the drain of the N-ch transistor 201 is connected to the source and gate of an N-ch transistor 202; and the drain of the N-ch transistor 202 is connected to the input of the inverter 204 and to a resistor 203 connected to the ground.

Figure 2:
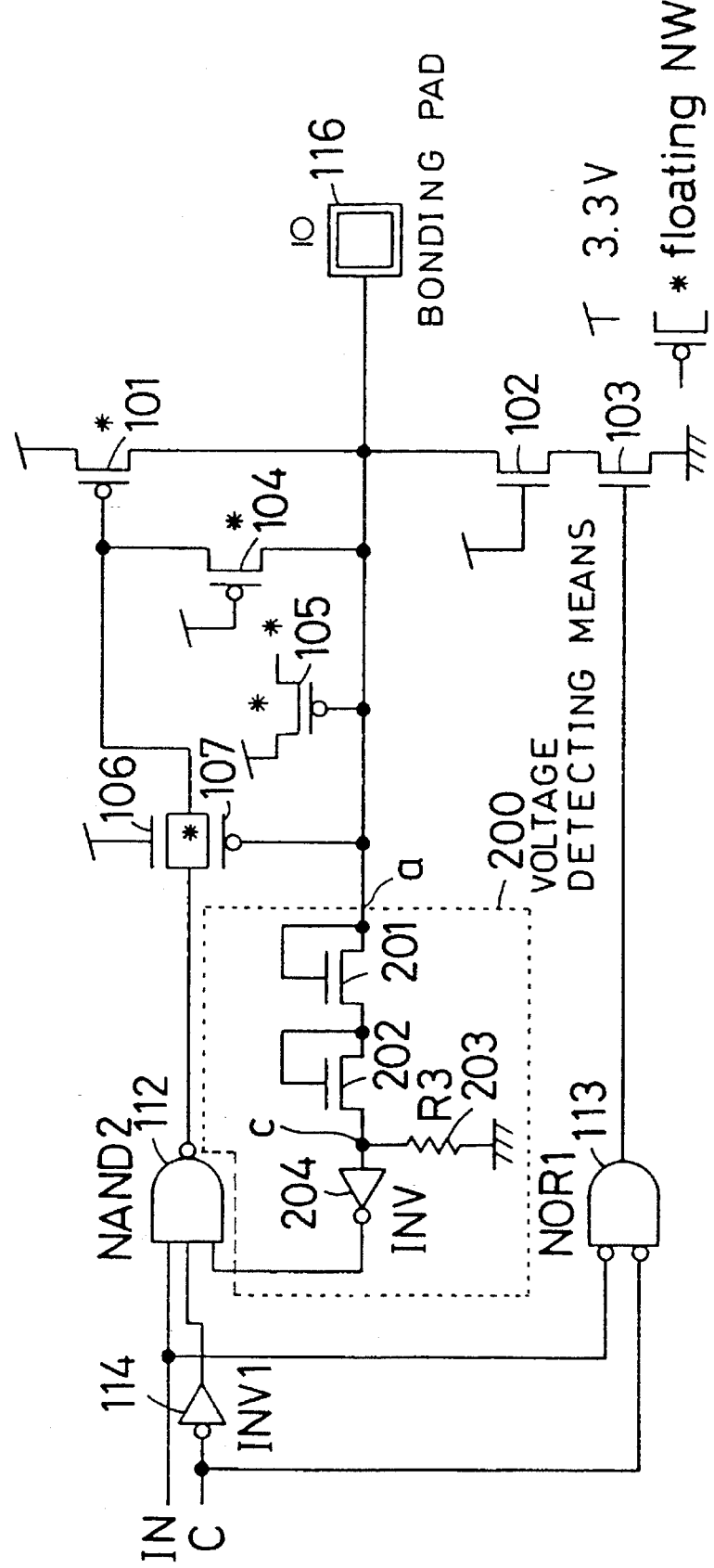
FIG. 2 is a view showing the structure of an output circuit in a second embodiment of the present invention.

In FIG. 2, components having like functions as those shown in FIG. 1 are designated by like reference numerals so that detailed description thereof will be omitted.

A description will be given to the operation of the output circuit thus constituted.

If the value of the resistor 203 is sufficiently large, the input potential of the inverter 204 has a value lower than the potential of the bonding pad 116 by the doubled threshold voltage 2·Vth of the N-ch transistors 201 and 202. If the above inverter 204 outputs a potential on the LOW level in response to the input equal to or higher than the voltage VDD-2 Vth, the output from the NAND circuit 112 does not shift to the LOW level during the period during which a potential equal to or higher than the internal power-source voltage VDD is applied to the bonding pad 116.

Thus, in the present embodiment, the pullup control signal to be inputted to the gate of the P-ch output transistor 201 connected to the output pad element 116 is turned OFF by the voltage detecting means 200 when the output potential of the bonding pad 116 makes a transition, similarly to the first embodiment, so that each transistor inside the output circuit is free from transient application of a voltage equal to or higher than the breakdown voltage thereof.

Here, the maximum voltage applied to transistors inside an output circuit (between the source and gate and between the gate and drain) when its output state makes a transition is simulated with a conventional output circuit which is not provided with the voltage detecting means used in the first and second embodiments and with the output circuits of the first and second embodiments. The results of simulation are shown in the following Table 1.

TABLE 1

| MODE | MAXIMUM VOLTAGE | TRANSISTOR NO. |
|---|---|---|
| CONVENTIONAL MODE | 4.11 V | 107 |
| FIRST EMBODIMENT | 3.23 V | 107 |
| SECOND EMBODIMENT | 3.00 V | 107 |

NOTE:
WITH 3 V INTERNAL VOLTAGE

As can be understood from the above Table 1, the maximum voltage is the lowest in the second embodiment. In the second embodiment, however, a leakage current is incessantly generated through the resistive element 203, which results in an increased consumed current. In the above voltage detecting means 120 and 200 of FIGS. 1 and 2 (apart from the P-ch transistor 111 in the voltage detecting means 120 of FIG. 1), for example, the number n of the transistors constituting the first voltage reducing means is determined so that the relationship represented by the following inequalities is established between the voltage at the inputs of the inverting circuits 115 and 204 (designated by "c" in each of the drawings) and the threshold voltages Vinv:

$$3 - n \cdot Vth < vinv < 5 - n \cdot Vth.$$

Since the number n is two in the first and second embodiments, if 2 is substituted in n, $$3 - 2 \cdot Vth < Vinv < 5 - 2 \cdot Vth$$

is obtained. The operations of the voltage detecting means 120 and 200 performed in this case are shown in the following Tables 2 and 3.

TABLE 2

| | HIGH IMPEDANCE STATE OR INPUT STATE (C = 1) | | | | | |
|---|---|---|---|---|---|---|
| | 5 V TO 3 V | | | 3 V TO 0 V | | |
| INPUT POTENTIAL | POTENTIAL AT POINT c | OUTPUT FROM INVERTER | CURRENT TO GROUND | POTENTIAL AT POINT c | OUTPUT FROM INVERTER | CURRENT TO GROUND |
| VOLTAGE DETECTING MEANS 120 | 3-Vth | LOW | ABSENT | 3-Vth | LOW | ABSENT |
| VOLTAGE DETECTING MEANS 200 | 5-2.Vth | LOW | PRESENT | 3-2.Vth | HIGH | PRESENT |

TABLE 3

| | OUTPUT STATE (C = LOW) | | | | | |
|---|---|---|---|---|---|---|
| | 5 V TO 3 V | | | 3 V TO 0 V | | |
| INPUT POTENTIAL | POTENTIAL AT POINT c | OUTPUT FROM INVERTER | CURRENT TO GROUND | POTENTIAL AT POINT c | OUTPUT FROM INVERTER | CURRENT TO GROUND |
| VOLTAGE DETECTING MEANS 120 | 3-Vth | LOW | PRESENT | 0 V | HIGH | ABSENT |
| VOLTAGE DETECTING MEANS 200 | 5-2.Vth | LOW | PRESENT | 3-2.Vth | HIGH | PRESENT |

As can be understood from the above Tables 2 and 3, in the voltage detecting means 120 of the first embodiment, a current flows to the ground only when a voltage of 3 V or higher exists on the bonding pad 116 in the output state. In the other states, no constant current flows. Hence, compared with the voltage detecting means 200 of the second embodiment, the voltage detecting means 120 of the first embodiment can achieve a further reduction in consumed current.

Although the manufacturing process is comparatively unstable in the second embodiment since it is implemented by using the resistor 203, the problem can be avoided with the circuit structure according to the above first embodiment.

Although the output circuits of the first and second embodiments are constituted so that the P-ch transistors 101, 104, 105, 107, and 108 use the substrate in common to which no internal power-source voltage VDD has been applied, it is also possible to maintain the respective substrate potentials of these transistors at a constant external potential, i.e., 5 V here, and to omit the P-ch transistor 105.

Although the first and second embodiments have been described on the assumption that the circuits used therein are output circuits, it is also possible to alternatively use input/output circuits obtained by adding input circuits to the output circuits.

FIG. 4 shows an input/output circuit obtained by adding, to the output circuit of the above first embodiment, inverters INV2, INV3, INV4, and INV 5 as drivers, resistors 219 and 220 for providing protection against voltage, bipolar transistors 217 and 218 against surge, and an input circuit A. In the input circuit A, a reference numeral 225 designates a resistor R2, reference numerals 226 and 228 designate N-ch transistors, a reference numeral 227 designates a P-ch transistor, and reference numerals 229 to 232 designate inverters INV6 to INV9.

Figure 5:
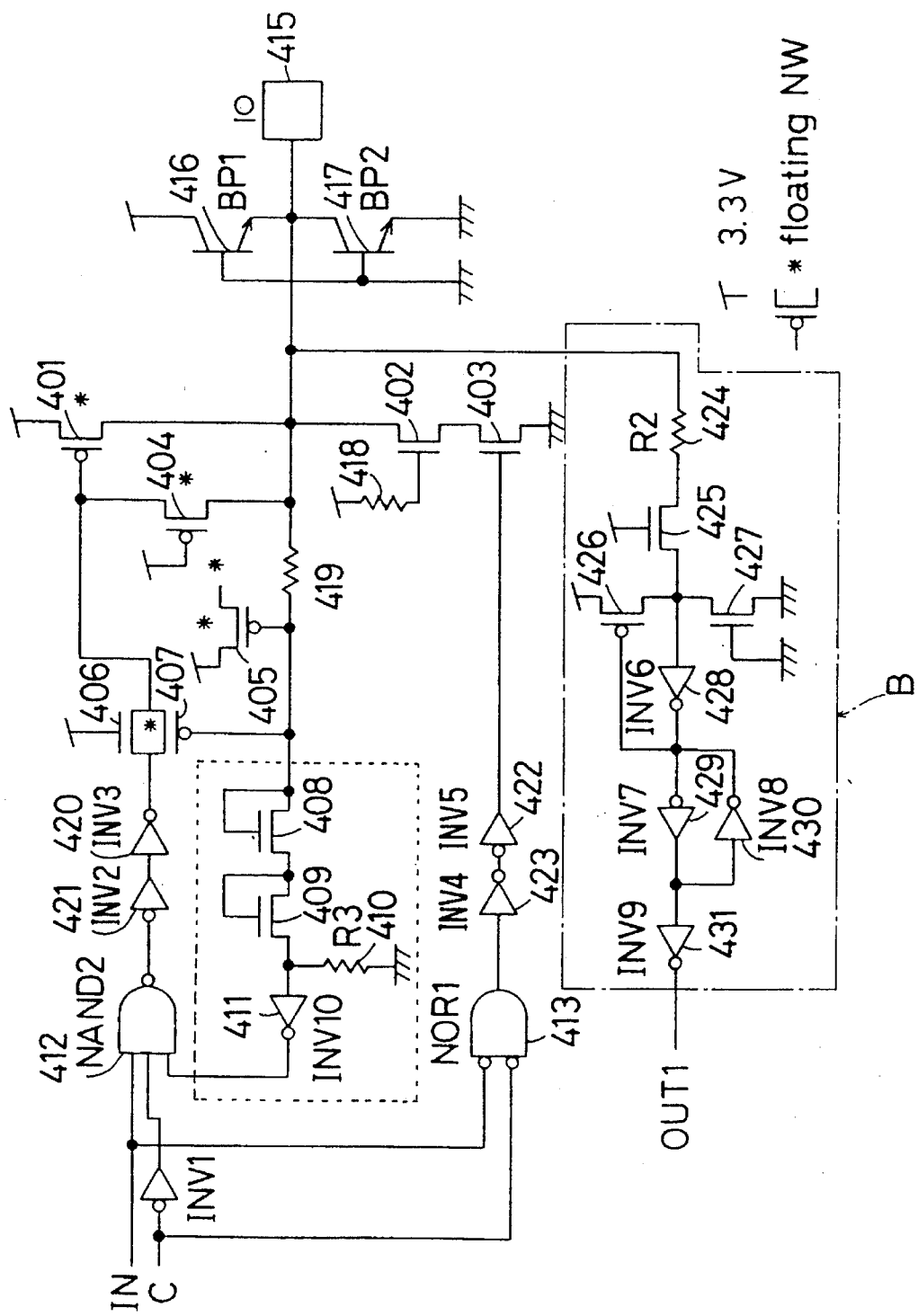
FIG. 5 is a view showing the structure of an input/output circuit obtained by adding an input circuit to the output circuit of the second embodiment.

FIG. 5 shows an input/output circuit obtained by adding, to the output circuit of the above second embodiment, the inverters INV2, INV3, INV4, and INV5 as drivers, resistors 419 and 418 for providing protection against voltage, bipolar transistors 416 and 417 against surge, and an input circuit B. In the input circuit B, a reference numeral 424 designates the resistor R2, reference numerals 425 and 427 designate N-ch transistors, a reference numeral 426 designates a P-ch transistor, reference numerals 428 to 431 designate the inverters INV6 to INV9.

Figure 6:
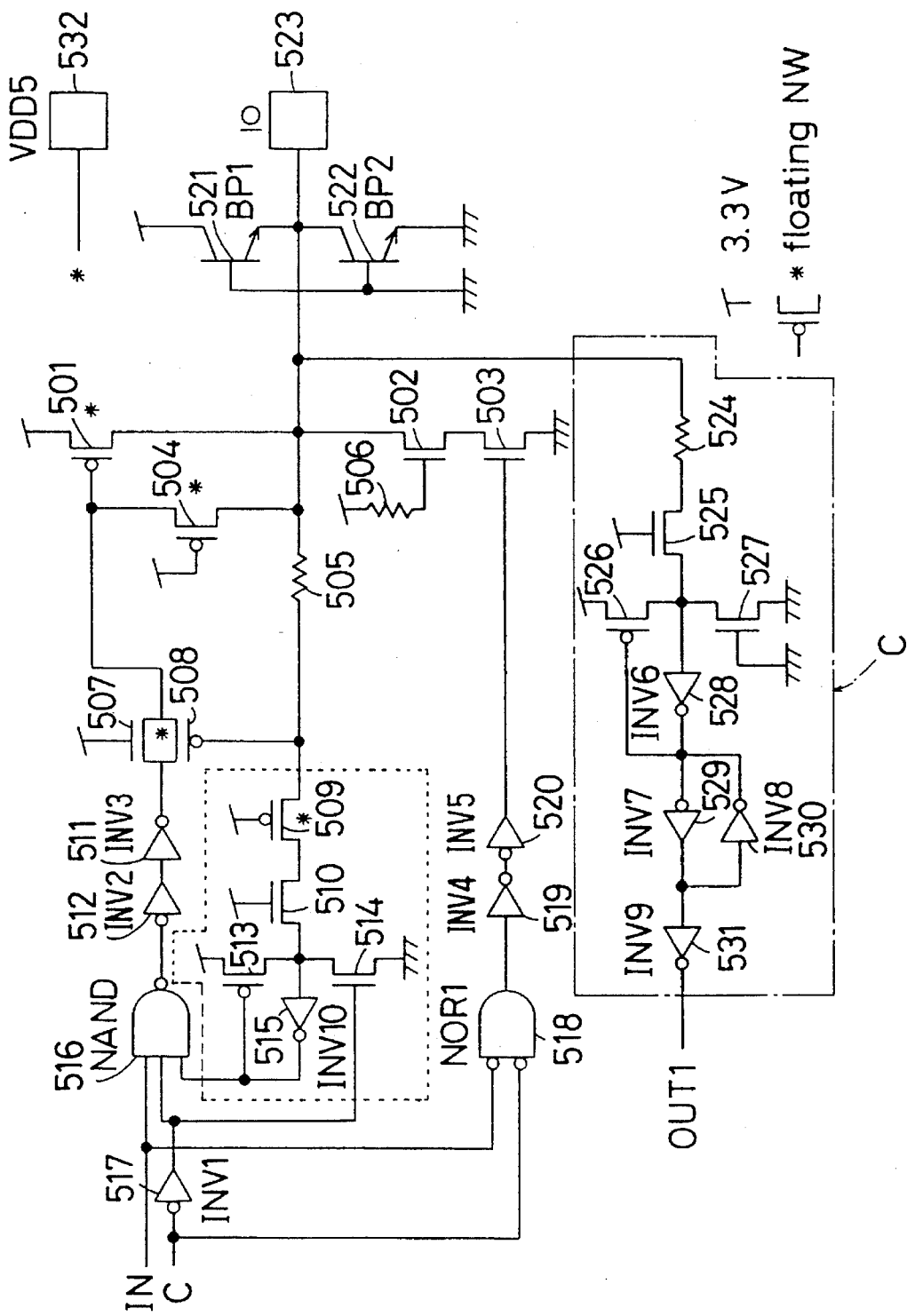
FIG. 6 is a view showing the structure of an input/output circuit obtained by adding another input circuit to the output circuit of the first embodiment.

FIG. 6 shows an input/output circuit obtained by: adding, to the output circuit of the first embodiment, the inverters INV2, INV3, INV4, and INV 5 as drivers, resistors 505 and 506 for providing protection against voltage, bipolar transistors 21 and 522 against surge, and an input circuit C; maintaining the N-well of the N-ch transistor, which has been made floating in the first embodiment, at a constant voltage of 5 V; and omitting an element equivalent to the P-ch transistor 205 of FIG. 4. In the above input circuit C, a reference numeral 524 designates a resistor, reference numerals 525 and 527 designate N-ch transistors, a reference numeral 526 designates a P-ch transistor, and reference numerals 528 to 531 designate inverters INV6 to INV9.

In the first and second embodiments, it is also possible to intervene the circuit with a buffer for enhancing the driving ability thereof and with a resistor for preventing direct application of a voltage from the bonding pad 106 to a gate or the like.

FIGS. 7 show different variations of the voltage detecting means 120 and 200 of the above first and second embodiments. Each of the voltage detecting means 120 and 200 consists of, as shown in FIG. 7(x), the first voltage reducing means 125, the second voltage reducing means 126, and the inverting circuit 115. FIG. 7(a) shows the same structure as adopted in the first embodiment. FIG. 7(b) shows the first voltage reducing means composed of two N-ch transistors 701 and 702 connected in series. To the respective gates and sources of the N-ch transistors 701 and 702 is inputted an input signal, while the potential of the drain of each of the N-ch transistors 701 and 702 is used as the output from the first voltage reducing means.

On the other hand, FIG. 7(c) shows the first voltage reducing means composed of a series circuit of two diodes 703 and 704, while FIG. 7(d) shows the first voltage reducing means composed of a single N-ch transistor 705. To the gate of the N-ch transistor 705 is applied the on-chip power-source voltage VDD. To the source of the N-ch transistor 705 is inputted an input signal, while the potential of the drain thereof is used as the output from the first voltage reducing means. It is also possible to compose the first voltage reducing means of a P-ch transistor or a resistive element, instead of the above N-ch transistor 705 of FIG. 7(d), though the drawing thereof is omitted here.

Each of FIGS. 7(e) to 7(h) shows the second voltage reducing means composed of a resistive element R3, instead of the N-ch transistor 110 shown in FIGS. 7(a) to 7(e). In each of FIGS. 7(g) to 7(l), the second voltage reducing means is composed of a diode 706, instead of the above resistive elements R3.

FIG. 8 shows another variation of the above voltage detecting means 120 and 200 of the first and second embodiments. As shown in FIG. 8(y), the present variation is obtained by adding, to the first voltage reducing means 125, the second voltage reducing means 126, and the inverting circuit 115, a third voltage reducing means 800 between the first voltage reducing means 125 and the inverting circuit 115. Specifically, the third voltage reducing means 800 is composed of an N-ch transistor 801, as shown in FIGS. 8(m) to 8(w). The N-ch transistor 801 is constituted so that the on-chip power-source voltage VDD is applied to its gate, an input signal is inputted to its source, and the potential of its drain is used as the output from the third voltage reducing means 800. It is also possible to compose the third voltage reducing means of a resistive element, though the drawing thereof is omitted here.

Figure 8Y:
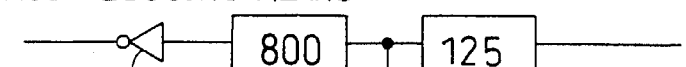
FIG. 8(*y*) is a block diagram showing another basic structure of the voltage detecting means.
Figure 8M:
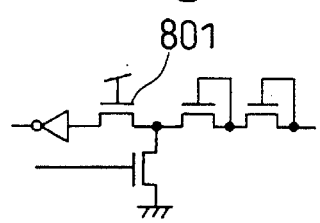
Figure 8Q:
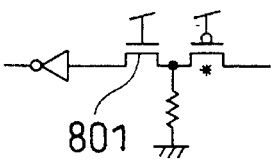
Figure 8U:
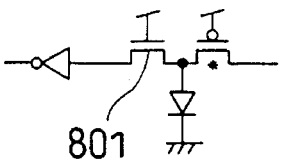
Figure 8N:
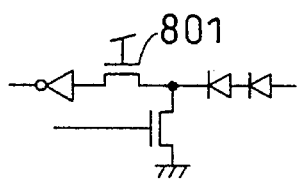
Figure 8R:
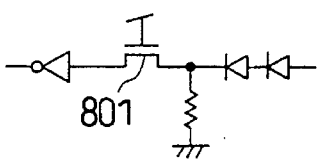
Figure 8V:
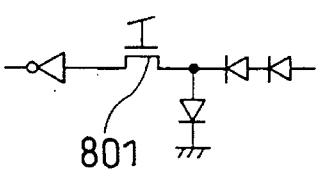
Figure 8O:
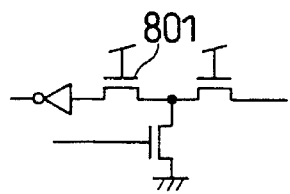
Figure 8S:
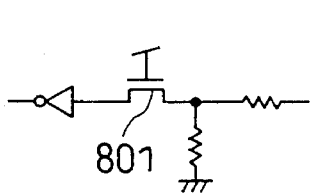
Figure 8W:
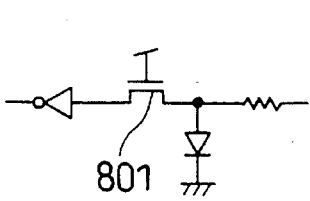
Figure 8P:
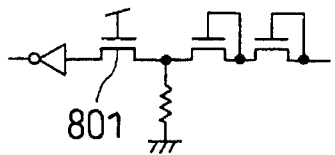
Figure 8T:
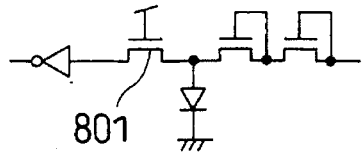

The operations of the above different variations of the voltage detecting means shown in FIGS. 8(a) to 8(w) are shown in the following Tables 4 and 5.

TABLE 4

| | HIGH IMPEDANCE STATE OR INPUT STATE (C = 1) | | | | | |
|---|---|---|---|---|---|---|
| | 5 V TO 3 V | | | 3 V TO 0 V | | |
| INPUT POTENTIAL | POTENTIAL BEFORE INPUTTED TO INVERTER | OUTPUT FROM INVERTER | CURRENT TO GROUND | POTENTIAL BEFORE INPUTTED TO INVERTER | OUTPUT FROM INVERTER | CURRENT TO GROUND |
| CIRCUIT (a) | 3-Vth | LOW | ABSENT | 3-Vth | LOW | ABSENT |
| CIRCUIT (b) | 5-2 Vth | LOW | ABSENT | 3-2 Vth to 5-2 Vth | HIGH/LOW | ABSENT |
| CIRCUIT (c) | 5-2 Vth | LOW | ABSENT | 3-2 Vth to 5-2 Vth | HIGH/LOW | ABSENT |
| CIRCUIT (d) | 5-Vth | LOW | ABSENT | 3-Vth | HIGH | ABSENT |
| CIRCUIT (e) | 5-2 Vth | LOW | PRESENT | 3-2 Vth | HIGH | PRESENT |
| CIRCUIT (f) | 3-Vth | LOW | PRESENT | 3-Vth | LOW | ABSENT |
| CIRCUIT (g) | 5-2 Vth | LOW | PRESENT | 3-2 Vth | HIGH | PRESENT |
| CIRCUIT (h) | 5-Vth | LOW | PRESENT | 3-2 Vth | HIGH | PRESENT |
| CIRCUIT (i) | 5-2 Vth | LOW | PRESENT | 3-2 Vth | HIGH | PRESENT |
| CIRCUIT (j) | 3-Vth | LOW | PRESENT | 3-Vth | LOW | ABSENT |
| CIRCUIT (k) | 5-2 Vth | LOW | PRESENT | 3-2 Vth | HIGH | PRESENT |
| CIRCUIT (l) | 5-Vth | LOW | PRESENT | 3-2 Vth | HIGH | PRESENT |
| CIRCUIT (m) | 5-3 Vth | LOW | ABSENT | 3-3 Vth to 5-3 Vth | HIGH/LOW | ABSENT |
| CIRCUIT (n) | 5-3 Vth | LOW | ABSENT | 3-3 Vth to 5-3 Vth | HIGH/LOW | ABSENT |
| CIRCUIT (o) | 5-2 Vth | LOW | ABSENT | 3-2 Vth | HIGH | ABSENT |
| CIRCUIT (p) | 5-3 Vth | LOW | PRESENT | 3-3 Vth | HIGH | PRESENT |
| CIRCUIT (q) | 3-Vth | LOW | PRESENT | 3-Vth | LOW | ABSENT |
| CIRCUIT (r) | 5-3 Vth | LOW | PRESENT | 3-3 Vth | HIGH | PRESENT |
| CIRCUIT (s) | 5-Vth | LOW | PRESENT | 3-2 Vth | HIGH | PRESENT |
| CIRCUIT (t) | 5-2 Vth | LOW | PRESENT | 3-2 Vth | HIGH | PRESENT |
| CIRCUIT (u) | 3-Vth | LOW | PRESENT | 3-Vth | LOW | ABSENT |
| CIRCUIT (v) | 5-2 Vth | LOW | PRESENT | 3-2 Vth | HIGH | PRESENT |
| CIRCUIT (w) | 5-Vth | LOW | PRESENT | 3-2 Vth | HIGH | PRESENT |

TABLE 5

| | OUTPUT STATE (C = LOW) | | | | | |
|---|---|---|---|---|---|---|
| | 5 V TO 3 V | | | 3 V TO 0 V | | |
| INPUT POTENTIAL | POTENTIAL BEFORE INPUTTED TO INVERTER | OUTPUT FROM INVERTER | CURRENT TO GROUND | POTENTIAL BEFORE INPUTTED TO INVERTER | OUTPUT FROM INVERTER | CURRENT TO GROUND |
| CIRCUIT (a) | 3-Vth | LOW | PRESENT | 0 V | HIGH | ABSENT |
| CIRCUIT (b) | 5-2 Vth | LOW | PRESENT | 3-2 Vth | HIGH | PRESENT |
| CIRCUIT (c) | 5-2 Vth | LOW | PRESENT | 3-2 Vth | HIGH | PRESENT |
| CIRCUIT (d) | 5-Vth | LOW | PRESENT | 3-Vth | HIGH | PRESENT |
| CIRCUIT (e) | 5-2 Vth | LOW | PRESENT | 3-2 Vth | HIGH | PRESENT |
| CIRCUIT (f) | 3-Vth | LOW | PRESENT | 0 V | HIGH | ABSENT |
| CIRCUIT (g) | 5-2 Vth | LOW | PRESENT | 3-2 Vth | HIGH | PRESENT |
| CIRCUIT (h) | 5-Vth | LOW | PRESENT | 3-Vth | HIGH | PRESENT |
| CIRCUIT (i) | 5-2 Vth | LOW | PRESENT | 3-2 Vth | HIGH | PRESENT |
| CIRCUIT (j) | 3-Vth | LOW | PRESENT | 0 V | HIGH | ABSENT |

TABLE 5-continued

| | OUTPUT STATE (C = LOW) | | | | | |
|---|---|---|---|---|---|---|
| | 5 V TO 3 V | | | 3 V TO 0 V | | |
| INPUT POTENTIAL | POTENTIAL BEFORE INPUTTED TO INVERTER | OUTPUT FROM INVERTER | CURRENT TO GROUND | POTENTIAL BEFORE INPUTTED TO INVERTER | OUTPUT FROM INVERTER | CURRENT TO GROUND |
| CIRCUIT (k) | 5-2 Vth | LOW | PRESENT | 3-2 Vth | HIGH | PRESENT |
| CIRCUIT (l) | 5-Vth | LOW | PRESENT | 3-Vth | HIGH | PRESENT |
| CIRCUIT (m) | 5-3 Vth | LOW | PRESENT | 3-3 Vth | HIGH | PRESENT |
| CIRCUIT (n) | 5-3 Vth | LOW | PRESENT | 3-3 Vth | HIGH | PRESENT |
| CIRCUIT (o) | 5-2 Vth | LOW | PRESENT | 3-2 Vth | HIGH | PRESENT |
| CIRCUIT (p) | 5-3 Vth | LOW | PRESENT | 3-3 Vth | HIGH | PRESENT |
| CIRCUIT (q) | 3-Vth | LOW | PRESENT | 0 V | HIGH | ABSENT |
| CIRCUIT (r) | 5-3 Vth | LOW | PRESENT | 3-3 Vth | HIGH | PRESENT |
| CIRCUIT (s) | 5-Vth | LOW | PRESENT | 3-Vth | HIGH | PRESENT |
| CIRCUIT (t) | 5-2 Vth | LOW | PRESENT | 3-2 Vth | HIGH | PRESENT |
| CIRCUIT (u) | 3-Vth | LOW | PRESENT | Vth | HIGH | ABSENT |
| CIRCUIT (v) | 5-2 Vth | LOW | PRESENT | 3-2 Vth | HIGH | PRESENT |
| CIRCUIT (w) | 5-Vth | LOW | PRESENT | 3-Vth | HIGH | PRESENT |

As described above, the output circuit of the present invention can be constituted so that a transient voltage equal to or higher than an on-chip power-source voltage is not placed on an oxide film of a transistor internally provided therein. Consequently, in an LSI fabricated using submicron design rules, there can be implemented an output circuit which withstands an input voltage equal to or higher than the breakdown voltage of an oxide film, thereby increasing the reliability of the LSI. In particular, if an actual on-chip power-source is 3.3 V and an actual voltage of the external signal line connected to the pad element is 5 V, a 0.5 μm CMOS-LSI (breakdown voltage of 3.6 V) can be used in conjunction with the LSI.

We claim:

1. An output circuit connected to an internal power source so as to output a signal having a voltage of said internal power source to an external signal line, wherein
   a signal having a higher voltage than the voltage of said internal power source is applied to said external signal line by a circuit other than said output circuit,
   said output circuit comprises:
   an output pad element to which said external signal line is connected;
   a signal generating circuit for receiving an external control signal inputted from the outside and generating a pullup control signal based on the external control signal;
   an output transistor which is interposed between said internal power source and said output pad element and which is turned ON in response to the pullup control signal from said signal generating circuit so as to supply the voltage of said internal power source as a signal to said output pad element; and
   a voltage detecting means for receiving a signal from said external signal line, detecting a voltage value of the external signal higher than a voltage value in the vicinity of the voltage value of said internal power source, and generating a voltage detection signal;
   the generation of the pullup control signal by said signal generating circuit being inhibited by the voltage detection signal from said voltage detecting means, irrespective of the content of said external control signal.

2. An output circuit according to claim 1, wherein the output transistor is composed of a P-channel transistor.

3. An output circuit according to claim 1, wherein the signal generating circuit is composed of an NAND circuit.

4. An output circuit according to claim 1, wherein the voltage detecting means consists of:
   a first voltage reducing means for receiving the signal from the external signal line and reducing the voltage of the signal;
   a second voltage reducing means for receiving an output voltage from said first voltage reducing means and reducing the input voltage, said second voltage reducing means being connected to the ground power source; and
   an inverting circuit for inverting the output from said first voltage reducing means,
   an output from said inverting circuit being used as an output from said voltage detecting means.

5. An output circuit according to claim 1, wherein the voltage detecting means consists of:
   a first voltage reducing means for receiving the signal from the external signal line and reducing the voltage of the signal;
   a second voltage reducing means for receiving an output voltage from said first voltage reducing means and reducing the input voltage, said second voltage reducing means being connected to the ground power source;
   a third voltage reducing means for receiving the output voltage from said first voltage reducing means and reducing the input voltage; and
   an inverting circuit for inverting an output voltage from said third voltage reducing means,
   an output from said inverting circuit being used as an output from said voltage detecting means.

6. An output circuit according to claim 4 or 5, wherein
   the first voltage reducing means is composed of a plurality of N-channel transistors connected in series,
   each of said N-channel transistors having its source connected to a drain of the N-channel transistor in the previous stage and to a gate of its own,
   the signal from the external signal line is inputted to a source of the N-channel transistor in the first stage and a voltage of a drain of the N-channel transistor in the final stage is used as the output from the first voltage reducing means.

7. An output circuit according to claim 4 or 5, wherein
   the first voltage reducing means is composed of N (N is an integer equal to or more than 2) diodes connected in series.

8. An output circuit according to claim 4, wherein the first voltage reducing means is composed of a P-channel transistor and an N-channel transistor, a drain of the P-channel transistor being connected to a source of the N-channel transistor, a gate of said P-channel transistor is connected to the internal power source, while its source receives the signal from the external signal line, and a gate of said N-channel transistor is connected to the internal power source, while a voltage of its drain is used as the output from the first voltage reducing means.

9. An output circuit according to claim 4 or 5, wherein the first voltage reducing means is composed of a single N-channel transistor, its gate being connected to the internal power source, its source receiving the signal from the external signal line, a voltage of its drain being used as the output from the first voltage reducing means.

10. An output circuit according to claim 4 or 5, wherein the first voltage reducing means is composed of a single P-channel transistor, its gate being connected to the internal power source, its source receiving the signal from the external signal line, a voltage of its drain being used as the output from the first voltage reducing means.

11. An output circuit according to claim 4 or 5, wherein the first voltage reducing means is composed of a resistive element.

12. An output circuit according to claim 4 or 5, wherein the second voltage reducing means has a function of interrupting, based on a potential of the external control signal, a current flowing to the ground power source.

13. An output circuit according to claim 4 or 5, wherein the second voltage reducing means is composed of a single N-channel transistor, its gate being connected to the internal power source, its source receiving the output voltage from the first voltage reducing means, a voltage of its drain being used as an output from the second voltage reducing means.

14. An output circuit according to claim 4 or 5, wherein the second voltage reducing means is composed of a resistive element.

15. An output circuit according to claim 3 or 4, wherein the second voltage reducing means is composed of a diode.

16. An output circuit according to claim 12, wherein the second voltage reducing means is composed of a single N-channel transistor, its gate receiving the external control signal.

17. An output circuit according to claim 5, wherein the third voltage reducing means is composed of a single N-channel transistor, its gate being connected to the internal power source, its source receiving the output from the first voltage reducing means, a voltage of its drain being used as an output from the third voltage reducing means.

18. An output circuit according to claim 5, wherein the third voltage reducing means is composed of a resistive element.

19. An output circuit according to claim 4, wherein the voltage detecting means consists of first and second N-channel transistors, a resistive element, and an inverter, a gate and source of said first N-channel transistor receives the signal from the external signal line, a gate and source of said second N-channel transistor receives a voltage of a drain of said first N-channel transistor, said resistive element is interposed between a drain of said second N-channel transistor and the ground power source, said inverter inverts a voltage of the drain of said second N-channel transistor, and an inverted signal from said inverter is used as the output from the voltage detecting means.

20. An output circuit according to claim 5, wherein the voltage detecting means consists of first and second N-channel transistors, a single P-channel transistor, and an inverter, the internal power source is connected to a gate of said P-channel transistor, while its source receives the signal from the external signal line, the internal power source is connected to a gate of said first N-channel transistor, while a drain of said P-channel transistor is connected to a source of said first N-channel transistor, a drain of said first N-channel transistor is connected to a drain of said second N-channel transistor, the ground power source is connected to a source of said second N-channel transistor, and the external control signal is inputted to a gate of said second N-channel transistor, and said inverter outputs a signal obtained by inverting a voltage of the drain of said first N-channel transistor.

* * * * *